United States Patent
Fukuda

(10) Patent No.: US 7,752,579 B2
(45) Date of Patent: Jul. 6, 2010

(54) FILM THICKNESS PREDICTING PROGRAM, RECORDING MEDIUM, FILM THICKNESS PREDICTING APPARATUS, AND FILM THICKNESS PREDICTING METHOD

(75) Inventor: Daisuke Fukuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 553 days.

(21) Appl. No.: 11/641,025

(22) Filed: Dec. 19, 2006

(65) Prior Publication Data

US 2007/0300194 A1 Dec. 27, 2007

(30) Foreign Application Priority Data

Jun. 21, 2006 (JP) ............... 2006-171375

(51) Int. Cl.
*G06F 17/50* (2006.01)
*H01L 21/66* (2006.01)
*H01L 21/20* (2006.01)
*H01L 21/311* (2006.01)

(52) U.S. Cl. ............ 716/4; 716/1; 716/2; 716/21; 438/14; 438/584; 438/700

(58) Field of Classification Search ............ 716/1, 716/2, 4, 21; 356/36, 504, 511; 438/5, 14, 438/584, 700
See application file for complete search history.

(56) References Cited

U.S. PATENT DOCUMENTS

| | | | | |
|---|---|---|---|---|
| 5,459,099 A | * | 10/1995 | Hsu ........................... | 216/46 |
| 5,963,329 A | * | 10/1999 | Conrad et al. ............... | 356/613 |
| 6,057,558 A | * | 5/2000 | Yamamoto et al. ............ | 257/77 |
| 6,317,360 B1 | * | 11/2001 | Kanamori .............. | 365/185.01 |
| 6,403,444 B2 | * | 6/2002 | Fukuzumi et al. ........... | 438/396 |
| 6,979,578 B2 | * | 12/2005 | Venugopal ................... | 438/14 |
| 7,019,844 B2 | * | 3/2006 | Venugopal et al. .......... | 356/504 |
| 7,176,039 B1 | * | 2/2007 | Papasouliotis et al. ........ | 438/5 |
| 7,244,670 B2 | * | 7/2007 | Karabacak et al. ......... | 438/584 |
| 7,289,872 B1 | * | 10/2007 | Fukuda ...................... | 700/169 |
| 7,363,207 B2 | * | 4/2008 | Kamon ....................... | 703/13 |
| 7,476,909 B2 | * | 1/2009 | Nagai et al. ................... | 257/94 |
| 7,576,851 B2 | * | 8/2009 | Lally et al. ............... | 356/237.5 |
| 2004/0087041 A1 | * | 5/2004 | Perry et al. ..................... | 438/5 |
| 2005/0282369 A1 | * | 12/2005 | Karabacak et al. ......... | 438/584 |
| 2006/0094244 A1 | * | 5/2006 | Yamada et al. ............. | 438/700 |
| 2007/0169694 A1 | * | 7/2007 | Schwarm et al. ........... | 118/665 |
| 2008/0123080 A1 | * | 5/2008 | Maznev ...................... | 356/36 |
| 2008/0174784 A1 | * | 7/2008 | Colonna De Lega et al. ..... | 356/511 |

FOREIGN PATENT DOCUMENTS

JP 2003-257915 9/2003

* cited by examiner

*Primary Examiner*—Helen Rossoshek
(74) *Attorney, Agent, or Firm*—Staas & Halsey LLP

(57) ABSTRACT

A film thickness predicting apparatus compares a measurement value of a copper plating formed on wiring grooves of various patterns measured using a TEG and a film thickness of the copper plating calculated based on a plating model and a condition file. The film thickness predicting apparatus then delivers optimal plating model from the comparison result and calculates the film thickness of the copper plating formed on a substrate surface to be designed using the optimal plating model. The film thickness predicting apparatus enables to conduct a highly accurate film thickness predicting simulation.

18 Claims, 10 Drawing Sheets

| WIRING WIDTH w | WIRING SPACE WIDTH s | HEIGHT OF COPPER PLATING H | HEIGHT OF CONVEX AND CONCAVE h |
|---|---|---|---|
| 0.1 | 0.1 | 200 | 20 |
| 0.1 | 1.0 | 100 | 100 |
| ⋮ | ⋮ | ⋮ | ⋮ |
| 10 | 10 | 100 | -20 |

FIG.13

| X COORDINATE OF AREA | Y COORDINATE OF AREA | WIRING DENSITY | EDGE LENGTH |
|---|---|---|---|
| 0 | 0 | 0.1 | 120 |
| 50 | 0 | 0.5 | 320 |
| 100 | 0 | 0.23 | 160 |
| ⋮ | ⋮ | ⋮ | ⋮ |

FIG.14

| X COORDINATE OF AREA | Y COORDINATE OF AREA | HEIGHT OF COPPER PLATING H | HEIGHT OF CONVEX AND CONCAVE h |
|---|---|---|---|
| 0 | 0 | 100 | 20 |
| 50 | 0 | 200 | 100 |
| 100 | 0 | 100 | -20 |
| ⋮ | ⋮ | ⋮ | ⋮ |

FILM THICKNESS PREDICTING PROGRAM, RECORDING MEDIUM, FILM THICKNESS PREDICTING APPARATUS, AND FILM THICKNESS PREDICTING METHOD

CROSS-REFERENCE TO RELATED APPLICATIONS

This application is based upon and claims the benefit of priority from the prior Japanese Patent Application No. 2006-171375, filed on Jun. 21, 2006, the entire contents of which are incorporated herein by reference.

BACKGROUND OF THE INVENTION

1. Field of the Invention

The present invention relates to technology of manufacturing a semiconductor device for predicting film thickness of a thin film formed on the semiconductor device.

2. Description of the Related Art

Flatness is required in each layer as the semiconductor device becomes finer and multilayered. Specifically, in a wiring step of semiconductor device manufacturing, uniform planarization of a substrate surface applied with copper plating, etc., by polishing with a technology such as chemical mechanical planarization (CMP) has become important to improve the quality.

Polishing conditions are important to appropriately polish the copper plating formed on the substrate surface. The polishing conditions include, for example, polishing time, pressure of a polishing pad, and rotation speed when polishing, and the conditions need to be changed in accordance with film thickness of the copper plating.

Conventionally, using a test element group (TEG), optimal polishing conditions have been searched by conducting a film thickness predicting simulation of calculating the film thickness of the copper plating formed on the substrate surface with an equation model that expresses volume and height of the copper plating (for example, Japanese Patent Application Laid-Open Publication No. 2003-257915).

However, in some cases, deviation between the film thickness of the copper plating calculated by the film thickness predicting simulation and the actual film thickness of the copper plating formed on the substrate surface became large according to the conventional technology.

Therefore, a substrate surface could not be appropriately planarized in some cases, and connections of wirings or focus of wiring pattern do not match due to irregularity on the substrate surface, thereby causing a low yield.

The optimal polishing time may be searched by trial and error of a user. For example, a user polishes a substrate surface forming copper plating under certain polishing conditions and measures the film thickness of the copper plating after polishing. The user searches optimal polishing conditions to planarize the substrate surface by repeating the operation under various polishing conditions.

However, measurements of the film thickness need to be repeatedly conducted under various polishing conditions to search the optimal polishing conditions with this method. Therefore, tremendous operation time is required, thereby increasing designing periods and manufacturing costs.

SUMMARY OF THE INVENTION

It is an object of the present invention to at least solve the above problems in the conventional technologies.

A computer-readable recording medium according to one aspect of the present invention stores therein a computer program for predicting film thickness of a thin film formed on a substrate using a film thickness function model expressing volume and height of the thin film, with a test substrate having wiring grooves of a predetermined shape. The computer program makes a computer execute receiving input of possible values for parameters included in a groove-shape function model expressing a shape of the wiring grooves after expansion and contraction; computing model values to specify the shape of the wiring grooves after expansion and contraction by substituting the values received into the groove-shape function model; calculating the film thickness by substituting the model values and size data of the wiring grooves into the film thickness function model; calculating a difference between the calculated film thickness and film thickness obtained by measuring the film thickness; and determining optimal values for the parameters from among the possible values of the parameters based on the calculated difference.

An apparatus for predicting film thickness according to another aspect of the present invention predicts film thickness of a thin film formed on a substrate using a film thickness function model expressing volume and height of the thin film, with a test substrate having wiring grooves of a predetermined shape. The apparatus includes a receiving unit that receives input of possible values for parameters included in a groove-shape function model expressing a shape of the wiring grooves after expansion and contraction; a computing unit that computes model values to specify the shape of the wiring grooves after expansion and contraction by substituting the values received into the groove-shape function model; a film thickness calculating unit that calculates the film thickness by substituting the model values and size data of the wiring grooves into the film thickness function model; a difference calculating unit that calculates a difference between the calculated film thickness and film thickness obtained by measuring the film thickness; and a determining unit that determines optimal values for the parameters from among the possible values of the parameters based on the calculated difference.

A method according to still another aspect of the present invention is of predicting film thickness of a thin film formed on a substrate using a film thickness function model expressing volume and height of the thin film, with a test substrate having wiring grooves of a predetermined shape. The method includes receiving input of possible values for parameters included in a groove-shape function model expressing a shape of the wiring grooves after expansion and contraction; computing model values to specify the shape of the wiring grooves after expansion and contraction by substituting the values received into the groove-shape function model; calculating the film thickness by substituting the model values and size data of the wiring grooves into the film thickness function model; calculating a difference between the calculated film thickness and film thickness obtained by measuring the film thickness; and determining optimal values for the parameters from among the possible values of the parameters based on the calculated difference.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 13 is a table for illustrating a data structure of a chip data DB;

FIG. 14 is a table for illustrating a film thickness predicting file; and

DETAILED DESCRIPTION OF THE PREFERRED EMBODIMENTS

Exemplary embodiments according to the present invention will be explained in detail below with reference to the accompanying drawings.

Figure 1:
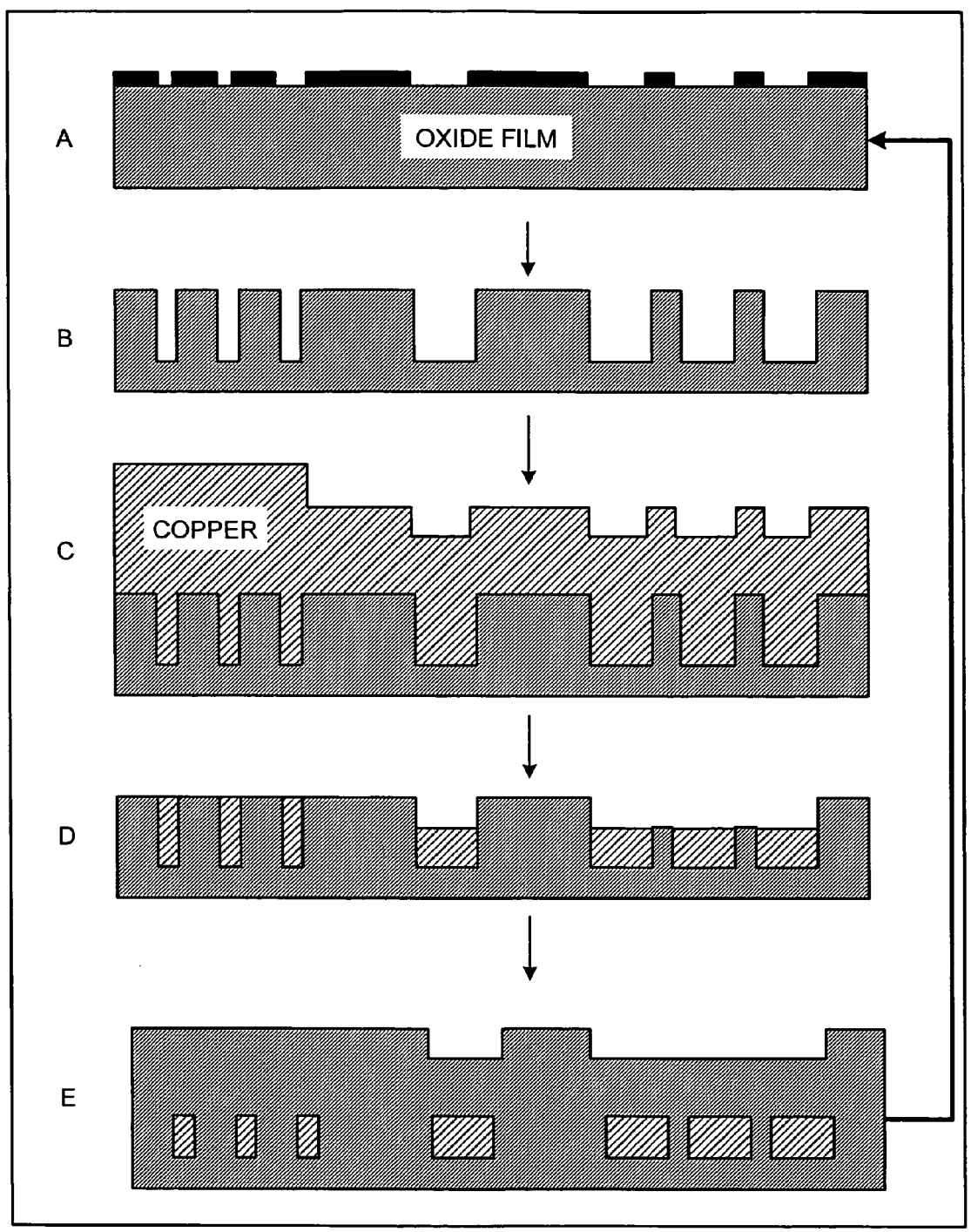
FIG. 1 is a schematic for explaining a manufacturing procedure of a large-scale integration (LSI)

FIG. 1 is a schematic for explaining a manufacturing procedure of an LSI. As shown in FIG. 1, when manufacturing an LSI, a light is applied to an oxide film formed on a substrate surface through a photomask to form a wiring pattern (FIG. 1A). A photomask is a thing that a wiring pattern of a semiconductor circuit is depicted with a lightproof material on a transparent glass substrate. Application of an ultraviolet ray on the oxide film through the photomask enables to transfer the wiring pattern of a semiconductor circuit.

Wiring grooves are then formed by etching the oxide film transferred with a wiring pattern (FIG. 1B). Etching means processing a form of an oxide film, etc., on a substrate surface using a chemical reaction (corrosion action) of chemicals or ions. The wiring grooves are grooves for forming wirings of a semiconductor circuit. Copper or aluminum high in electric conductivity is used as a material for wiring.

Copper plating is then generated on the oxide film by applying electrolytic plating (FIG. 1C). Although the plating here is generated with copper as an example, aluminum, etc., may be used to generate a plating. The electrolytic plating is an act of reducing metal ions with electrolysis reaction and of depositing a metal on the surface of a cathode conductive material.

Excessive copper of the generated copper plating is then removed by the chemical mechanical polishing (CMP) (FIG. 1D). The CMP is an act of mechanically trimming to planarize the uneven surface of the substrate surface of a semiconductor device, etc., with a chemical polishing agent or a pad.

After polishing, an oxide film is further formed over the oxide film that the wiring is formed (FIG. 1E). When forming a multilayered wiring, repeating the series of processes (FIGS. 1A to 1E) enables to form a multilayered semiconductor circuit on a substrate.

In the manufacturing step of an LSI, appropriate planarization of the substrate surface by polishing the substrate surface with the CMP is an important step (FIG. 1D). Because, when a substrate surface is not appropriately planarized, wirings formed on the substrate may contact each other or a wiring pattern may be out of focus due to irregularity of the substrate surface, causing lower yield.

To appropriately planarize the substrate surface, polishing conditions such as pressure of a pad, a rotation speed, and a polishing time upon polishing needs to be appropriately set. Polishing conditions to be set vary depending on the film thickness of the copper plating formed on a substrate surface (oxide film). Therefore, the film thickness of the copper plating that indicates how much the copper is accumulated on the substrate surface needs to be precisely figured out.

In consideration of expansion and contraction of the wiring grooves when the copper plating is generated, the film thickness of the copper plating is accurately predicted by conducting the film thickness predicting simulation using the groove-shape function model that expresses the shape after expansion and contraction according to the present invention. Especially, the height of irregularity formed on the copper plating surface of the wiring grooves due to expansion and contraction of the wiring grooves is accurately calculated to precisely predict the film thickness of the copper plating.

Figure 2:
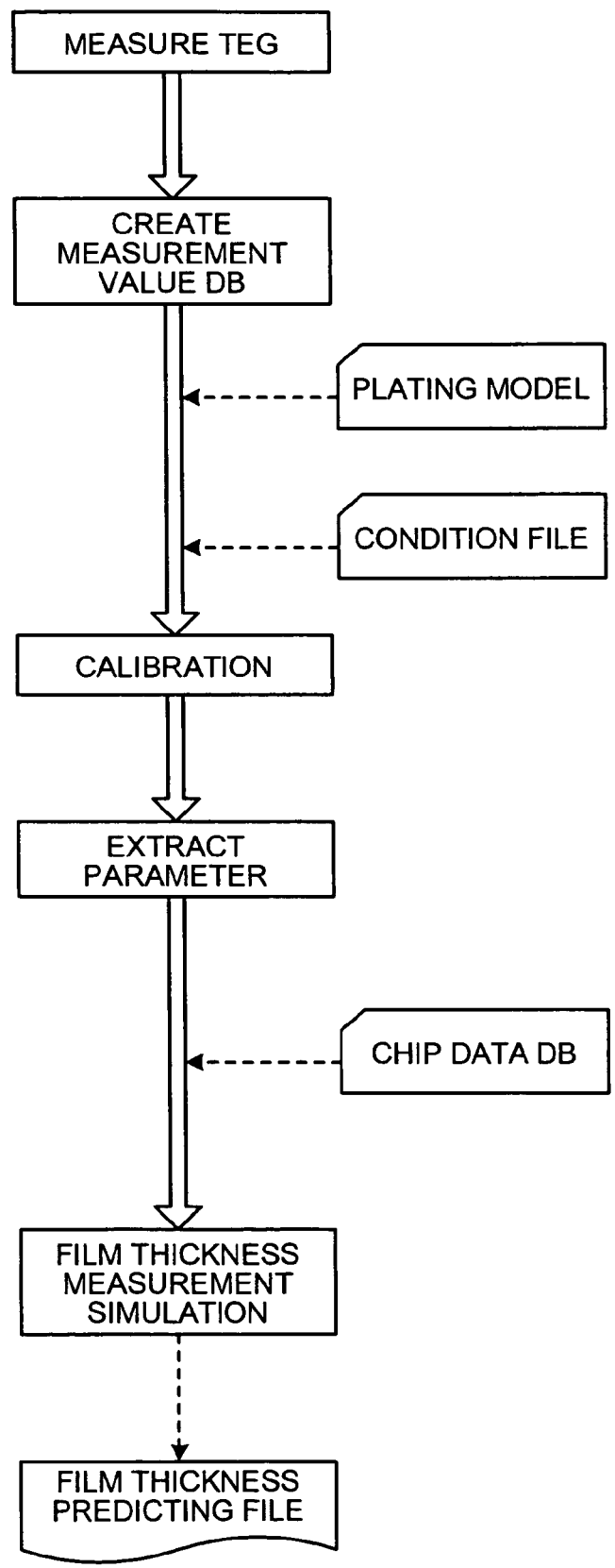
FIG. 2 is a schematic for explaining a film thickness predicting method according to an embodiment of the present invention.

FIG. 2 is a schematic for explaining a film thickness predicting method according to an embodiment of the present invention. As shown in FIG. 2, film thickness of the copper plating formed on the wiring grooves of various patterns is measured using the TEG. Specifically, wiring widths of various values, height of the copper plating on the wiring grooves formed by wiring space widths, and height of the irregularity formed on the wiring grooves when the copper plating is generated are measured.

The TEG is a test substrate for evaluation created to evaluate a material of the semiconductor circuit, a fundamental design, a fundamental process, etc., and to inspect a failure mechanism. The height of the copper plating and the height of the irregularity formed on the wiring grooves when generating the copper plating will be described later.

Figure 3:
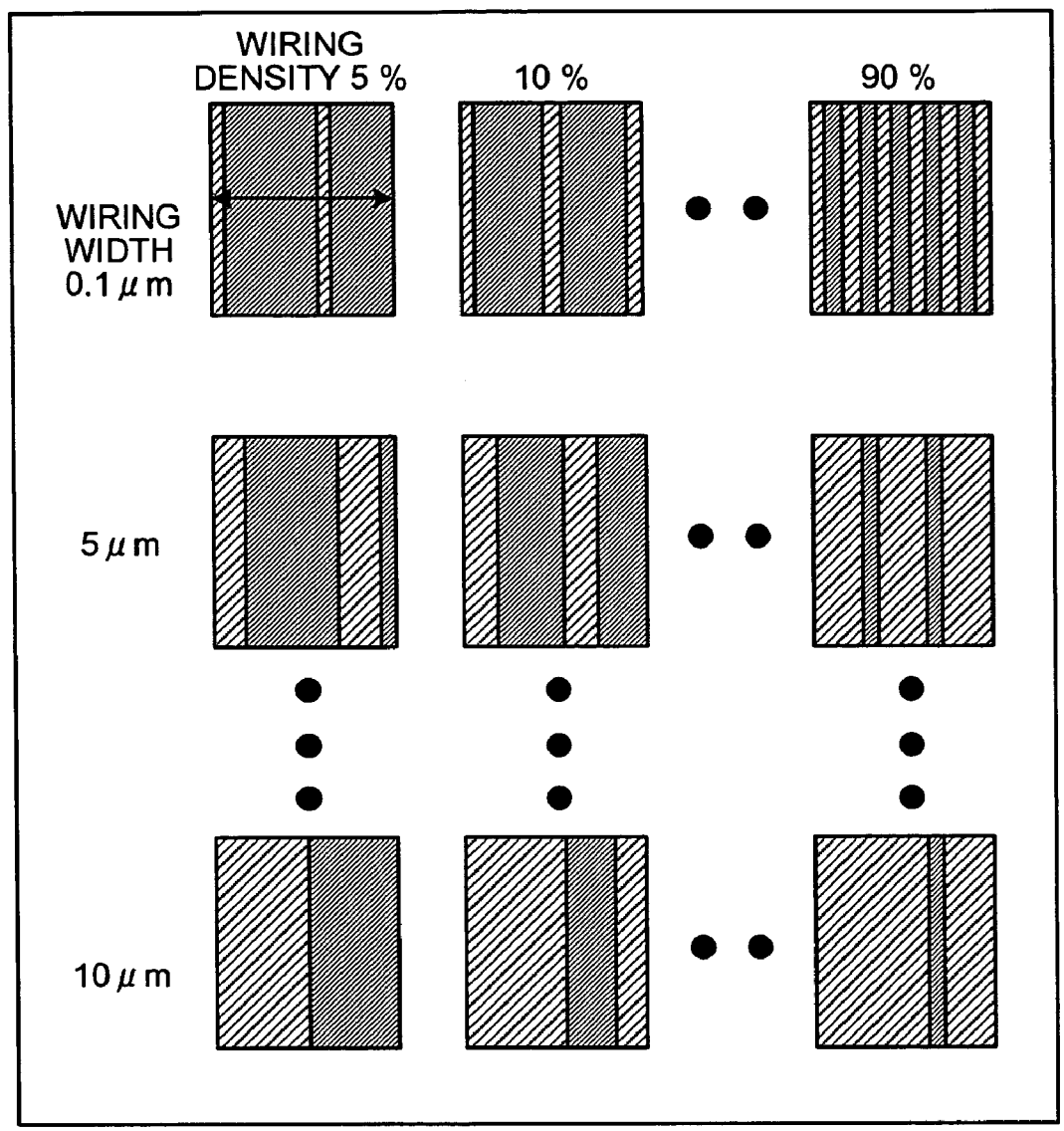
FIG. 3 is a schematic for explaining a TEG formed with wiring grooves of various patterns.

FIG. 3 is an explanatory view of one example of a TEG formed with wiring grooves of various patterns. As shown in FIG. 3, copper plating is generated on wiring grooves of various patterns by applying electrolytic plating. Wiring widths of various values, heights of the copper plating of the wiring density, and heights of the irregularities formed on the wiring grooves when the copper plating is generated are measured using the TEG. In addition to the patterns shown in FIG. 3, the heights $H_0$ of copper plating generated on substrates that the wiring grooves are not formed are measured.

A width between adjacent wiring grooves (wiring space width) can be found from a wiring width and a wiring density of FIG. 3. For example, if the wiring width is "1 (μm)" and the wiring density is "75(%)", since the wiring density of a certain area is "75(%)", the ratio of the wiring width and the wiring space width is "1:3". In other words, the wiring space width is "3 (μm)" that is three times as large as the wiring width.

A measurement value DB (database) is then created that stores measurement values of the measured wiring widths, the height of the copper plating of the wiring density, and the height of the irregularity formed on the wiring grooves when the copper plating is generated. The specific content of the measurement value DB will be described later.

Calibration (optimization) is then conducted using the wiring widths stored in the measurement value DB, the height of the copper plating of the wiring density, the height of the irregularity formed on the wiring grooves when the copper plating is generated, a plating model, and a condition file. The plating model includes a model equation expressing the volume and the height of the copper plating generated on the substrate surface and a model equation expressing the shapes of the wiring grooves after expansion and contraction. Possible values of the parameters included in the model equation expressing the shapes of the wiring grooves after expansion and contraction are written on the condition file.

The film thickness predicting simulation is conducted using the plating model and the condition file, and the height of the copper plating and the height of the irregularity are calculated. The values with the smallest deviation is then searched by comparing the calculation result of the same shaped wiring grooves calculated by the film thickness predicting simulation and the measurement values stored in the measurement value DB. The plating model and the condition file used for the film thickness simulation will be specifically described later.

Consequent to the calibration, values of the parameters that are sources of the calculation result with the smallest deviation are extracted as optimal values from the possible values of the parameters.

The film thickness simulation is lastly conducted using the extracted parameters (optimal values) and data stored in a chip data DB relating to an LSI that actually is to be designed to measure the film thickness of the copper plating generated on the surface of the substrate to be designed. A film thickness predicting file is outputted as the simulation result that indicates the film thickness of the copper plating at areas on the LSI surface. Specific contents of the chip data DB and the film thickness predicting file will be described later.

Figure 4:
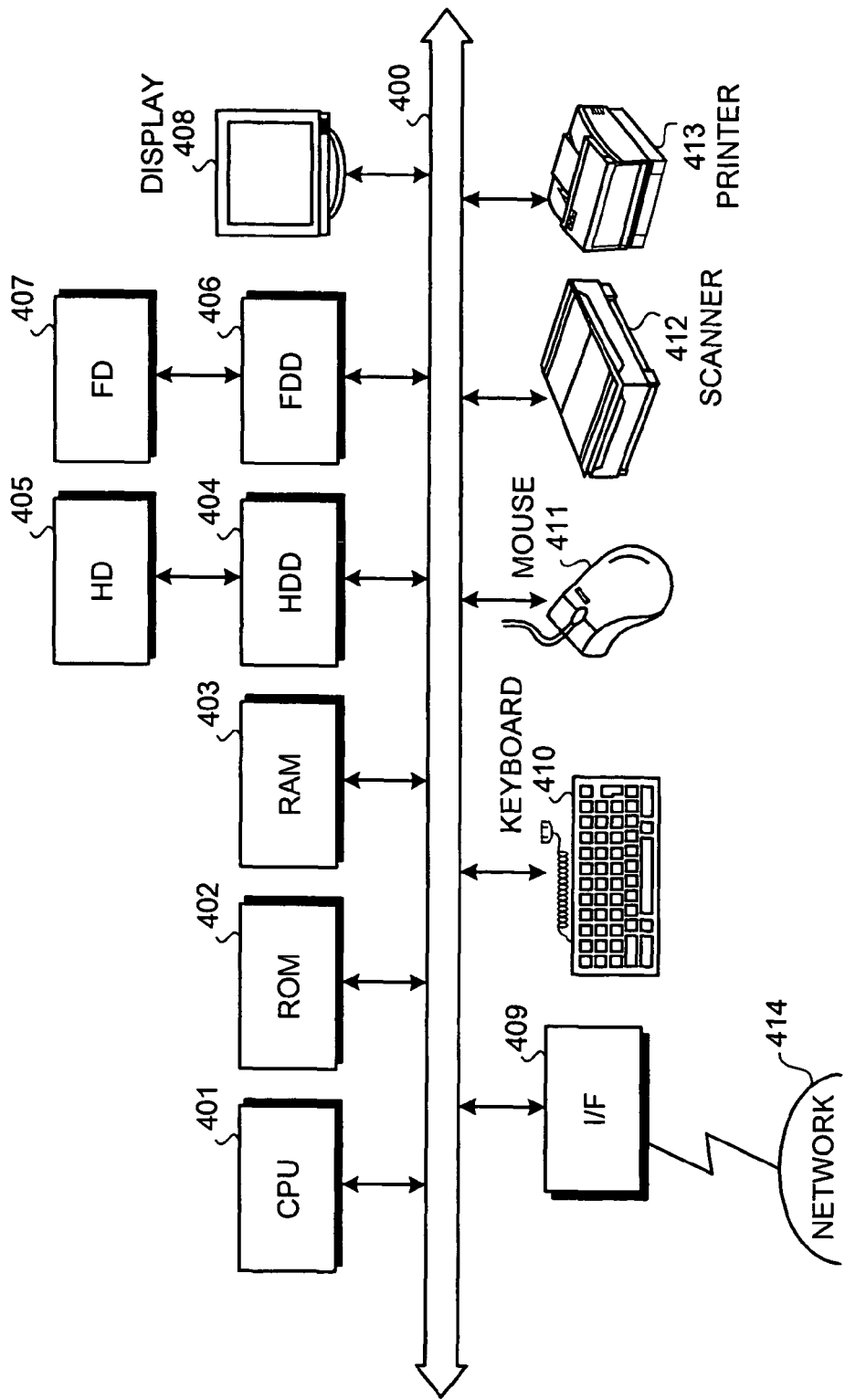
FIG. 4 is a schematic of a film thickness predicting apparatus according to the embodiment.

FIG. 4 is a block diagram of a hardware configuration of the film thickness predicting apparatus of the embodiment according to the present invention.

In FIG. 4, the film thickness predicting apparatus consists of a CPU 401, a ROM 402, a RAM 403, an HDD (hard disk drive) 404, an HD (hard disk) 405, an FDD (flexible disk drive) 406, an FD (flexible disk) 407 as one example of a removable recording medium, a display 408, an interface (I/F) 409, a keyboard 410, a mouse 411, a scanner 412, and a printer 413. These constituent units are connected to each other by a bus 400.

The CPU controls the entire film thickness predicting apparatus. The ROM 402 records programs such as a boot program. The RAM 403 is used as work area of the CPU 401. The HDD 404 controls reading/writing of data to/from the HD 405 in accordance with the control of the CPU 401. The HD 405 stores the data written under control of the HDD 404.

The FDD 406 controls reading/writing of data to/from the FD 407 in accordance with the control of the CPU 401. The FD 407 stores the data written under control of the FDD 406 and causes the film thickness predicting apparatus to read the data stored in the FD 407.

Other than the FD 407, a CD-ROM (CD-R, CD-RW), an MO, a digital versatile disk (DVD), a memory card, etc., may be used as a detachable recording medium. The display 408 displays data such as a cursor, icons, tool boxes, as well as, documents, images, function information, etc. A CRT, a TFT liquid crystal display, a plasma display, etc., can be employed as the display 408.

The I/F 409 is connected to a network 414 such as Internet through a communication line and is connected to other devices through the network 414. The I/F 409 controls the network 414 and an internal interface and controls input/output of data from external devices. A modem, a LAN adaptor, etc., can be employed as the I/F 409.

The keyboard 410 provides keys for inputting characters, numbers, various directions, etc., and inputs data. The keyboard 410 may be a touch-panel input pad or a numeric keypad. The mouse 411 moves a cursor, selects a range, moves a window, changes a size, etc. As long as equipped with a function similar to a pointing device, the mouse 411 may be a track ball, a joystick, etc.

The scanner 412 optically reads images and loads image data into the film thickness predicting apparatus. The scanner 412 may include an optical character recognition (OCR) function. The printer 413 prints image data and document data. A laser printer, an inkjet printer, etc., may be employed as a printer 413.

Figure 5:
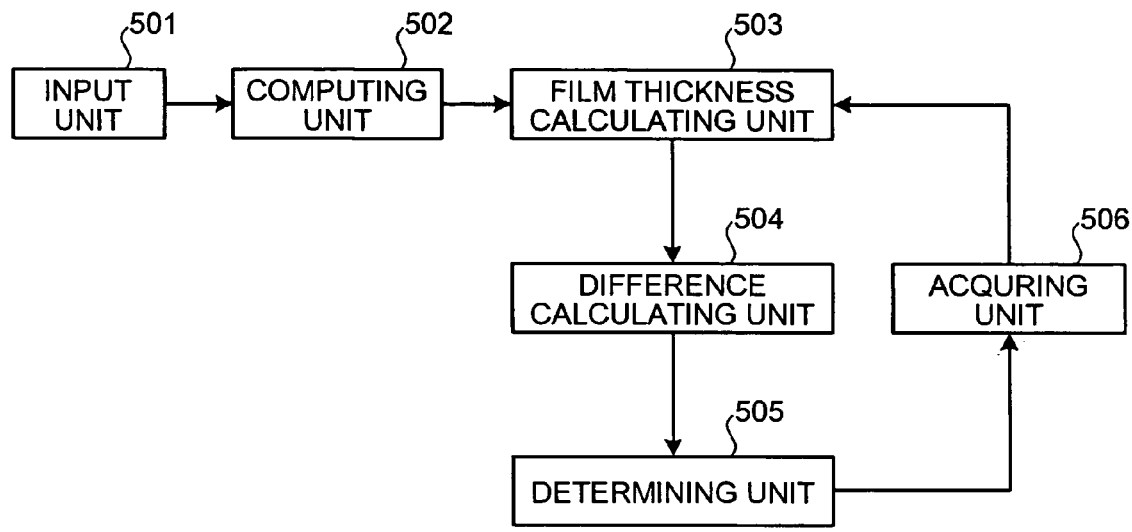
FIG. 5 is a block diagram of the film thickness predicting apparatus.

FIG. 5 is a block diagram of a functional configuration of the film thickness predicting apparatus of the embodiment according to the present invention. In FIG. 5, the film thickness predicting apparatus consists of an input unit 501, a computing unit 502, a film thickness calculating unit 503, a difference calculating unit 504, a determining unit 505, and an acquiring unit 506.

Utilizing a test substrate having wiring grooves of a predetermined shape, the film thickness predicting apparatus predicts the film thickness of the thin film formed on a substrate to be designed using a film thickness function model expressing the volume and the height of the thin film. The test substrate is a substrate for evaluation such as a TEG formed with wiring grooves of various shapes. A specific equation of the film thickness function model will be described later.

The input unit 501 accepts input of possible values of parameters included in the groove-shape function model expressing shapes of the wiring grooves after expansion and contraction. When a thin film such as copper plating is formed on the substrate surface during wiring formation, shapes of the wiring grooves change as the wiring grooves formed on the substrate expand and contract. The groove-shaped function model expressing shapes of the wiring grooves after expansion and contraction is an equation expressing an amount of changes in sizes of the wiring grooves caused by the expansion and contraction.

The groove-shaped function model, for example, is a model expressing changes in expansion widths and contraction widths of the wiring grooves. The expansion widths or contraction widths of the wiring grooves indicate amount of changes of the widths of the wiring grooves during expansion and contraction. In other words, contraction of the wiring grooves narrows the wiring widths for a length of the contraction widths, and expansion of the wiring grooves enlarges the wiring widths for a length of the expansion widths.

The groove-shape function model may be a model that expresses changes in the heights of the wiring grooves from a groove base. Specifically, the groove-shape function model expresses the heights of the wiring grooves when calculating the volume of the thin film using the film thickness function model. For example, the groove-shape function model expresses the lower limit of the height from the groove base (upper limit in depth of the wiring grooves from the top surface). The maximum value of the height of the wiring grooves expressed by the groove-shape function model is smaller than a value indicative of the actual height of the wiring grooves. A specific equation of the groove-shape function model will be described later.

The possible values of the parameters included in the groove-shaped function model may be specific values or a variable range of the parameters, or may be conditions of the possible values of the parameters. For example, if the variable range of a parameter A is "0<A<100" and the condition is "integer", the parameter can be a value of integers "1 to 99".

The computing unit 502 assigns values inputted by the input unit 501 to the groove-shape function model to compute model values for specifying the shapes of the wiring grooves after expansion and contraction. The model value is a value for specifying the shape of the wiring grooves after expansion and contraction, and, for example, is a specific value indicative of the contraction width or expansion width.

Specifically, the computing unit 502 assigns specific values to parameters included in the groove-shape function model to specify the shapes of the wiring grooves after expansion and contraction. In other words, the computing unit 502 specifies various shapes of the wiring grooves after expansion and contraction by changing the values of the parameters. The number of the specified shapes of the wiring grooves is the same as the total number of the possible values of the parameters (number of combinations of the parameters when a plurality of parameters exist).

The film thickness calculating unit 503 calculates the film thickness of the thin film formed on the test substrate by assigning the model values computed by the computing unit 502 and size data of the wiring grooves to the film thickness function model. The size data of the wiring grooves is data indicative of various shapes of the wiring grooves including a wiring width, a wiring space width indicative of a width between wires, a height (depth) of the wiring grooves, etc.

The difference calculating unit 504 calculates the difference between the calculation result of the film thickness of the thin film formed on the test substrate calculated by the film thickness calculating unit 503 and the measurement result of the film thickness of the thin film formed on the test substrate. In this case, the difference calculating unit 504 calculates the difference between the calculation result and the measurement result of the film thickness of the thin film at the wiring grooves indicated by the same size data. In other words, the difference calculating unit 504 compares the calculation result of the film thickness of the thin film calculated by changing the values of the parameters and the measurement result that is actually measured to calculate the deviation amount of the calculation result and the measurement result. The measurement of the film thickness of the thin film formed on the test substrate will be specifically described later.

The determining unit 505 determines an optimal value of the parameters from the possible values of the parameters based on the calculation result of the difference calculating unit 504. For example, the determining unit 505 may determine values of parameters as optimal values, the values of parameters that are sources of the calculation result of the film thickness calculating unit 503 and that minimize the calculation result of the difference calculating unit 504.

When the calculation result of the difference calculating unit 504 is the smallest, the deviation amount is small, indicating that the shapes of the wiring grooves specified by the values of the parameters that are the sources of the calculation result are the same as the actual shapes of the wiring grooves of the test substrate. Therefore, the values of parameters with the least deviation amount are determined to be the optimal values.

The acquiring unit 506 assigns the optimal values determined by the determining unit 505 to the groove-shape function model to acquire the computed model values. For example, the acquiring unit 506 assigns the optimal values from a recording medium storing the model values computed by the computing unit 502 to the groove-shape function model to acquire the computed model values. The acquiring unit 506 may be configured to acquire the model values computed by the computing unit 502 using the optimal values after the determining unit 505 determines the optimal values.

The film thickness calculating unit 503 may be configured to calculate the film thickness of the thin film formed on the substrate to be designed by assigning the model values acquired by the acquiring unit 506 and the size data of the wiring grooves that the substrate to be designed has to the film thickness function model.

Functions of the input unit 501, the computing unit 502, the film thickness calculating unit 503, the difference calculating unit 504, the determining unit 505, and the acquiring unit 506 are realized by, for example, the CPU 401 executing a program recorded in a recording medium such as the ROM 402, the RAM 403, the HD 405, and the FD 407 of FIG. 4. Steps of the film thickness predicting process described with reference to FIG. 2 will now be described in detail.

(Measurement of TEG)

Figure 6:
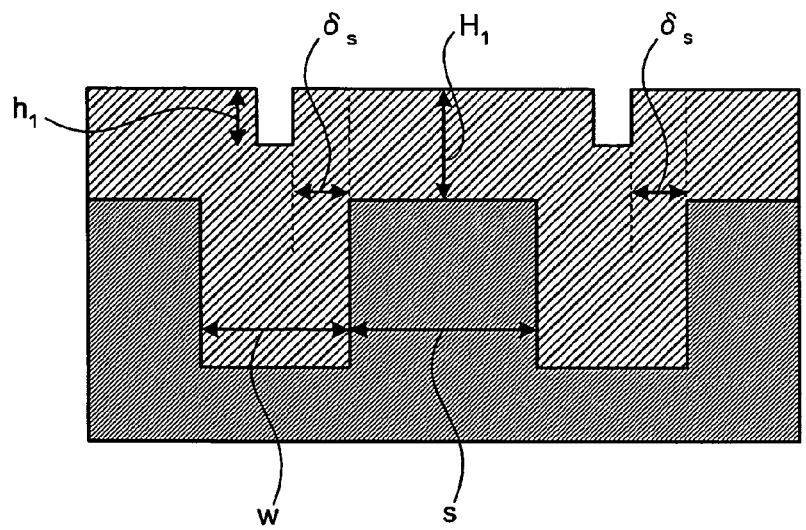
FIG. 6 is a schematic for explaining one example of copper plating generated on a substrate surface (part 1)
Figures 7, 8:
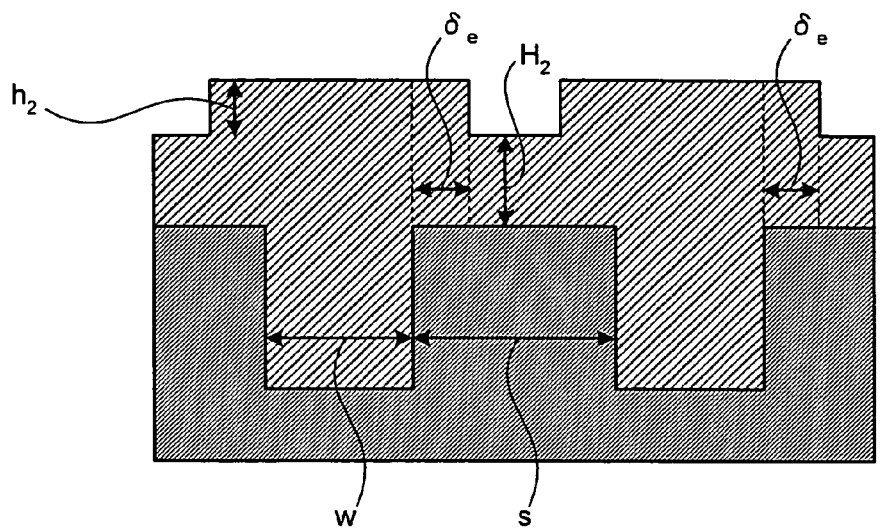
FIG. 7 is a schematic for explaining one example of the copper plating generated on the substrate surface (part 2)
FIG. 8 is a table for illustrating a data structure of a measurement value database (DB)

Measurement of the film thickness of copper plating formed on the wiring grooves of various patterns using the TEG will be described. FIG. 6 is an explanatory view of one example of copper plating generated on a substrate surface (part 1). FIG. 7 is an explanatory view of one example of copper plating generated on a substrate surface (part 2).

As shown in FIGS. 6 and 7, copper plating is formed on wiring grooves having a wiring width w and a wiring space s by applying electrolytic plating to a substrate surface (oxide film). When the electrolytic plating is applied to the substrate surface, the oxide film, i.e., wiring grooves expand and contract. This changes the lengths of the wiring width w and the wiring space s. The expansion and contraction of the wiring grooves generates irregularity on the surface of the copper plating formed on the wiring grooves. The height of the irregularity is equivalent to the height of the irregularity formed on the wiring grooves when the copper plating is generated.

For example, as shown in FIG. 6, if wiring grooves contract for a length of "$\delta_s$" (hereinafter, contraction width $\delta_s$) to one side when the electrolytic plating is applied to the substrate surface, the wiring width w narrows for a length of "$2\delta_s$". Concave portions with a height of "$h_1$" are then generated on the wiring grooves by the contraction of the wiring grooves. Copper plating with a height of "$H_1$" is formed on the substrate surface where the wiring grooves are not formed. This "$H_1$" is equivalent to the height of the copper plating.

As shown in FIG. 7, if the wiring grooves expand for a length of "$\delta_e$" (hereinafter, expansion width $\delta_e$) to one side when the electrolytic plating is applied to the substrate surface, the wiring width w enlarges for a length of "$2\delta_e$". Convex portions with a height of "$h_2$" are then generated on the wiring grooves by the expansion of the wiring grooves. Copper plating with a height of "$H_2$" is formed on the substrate surface where the wiring grooves are not formed. This "$H_2$" is equivalent to the height of the copper plating.

The heights of the copper plating and the heights of the irregularities formed on the wiring grooves when the copper plating is generated are measured for each of the wiring grooves with various shapes formed in the TEG of FIG. 3. The measurement result is stored in the measurement value DB.

Specific contents of the measurement value DB storing the heights of the copper plating of the wiring grooves of various shapes formed in the TEG and the heights of the irregularities formed on the wiring grooves when the copper plating is generated (hereinafter, "height of irregularity") will then be described. FIG. 8 is an explanatory view of one example of a data structure of the measurement value DB. Various values of wiring width w, height H of the copper plating with wiring space s, and height h of the irregularity are illustrated in the measurement value DB of FIG. 8. For example, when the wiring width w is "0.1 (μm)" and the wiring space s is "0.1 (μm)", the height H of the copper plating is "200 (μm)" and the height h of the irregularity is "20 (μm)". As described, the wiring width can be found from the wiring width and the wiring density.

The calibration comparing the height H of the copper plating of wiring widths w and wiring spaces s stored in the measurement value DB and the height h of the irregularity formed on the wiring grooves when the plating is generated to the simulation result of the film thickness predicting simulation will then be described.

A plating model used when conducting the calibration will first be described. The plating model is equivalent to the film thickness function model expressing the volume and the height of the thin film formed on the substrate and the groove-shape function model expressing the shapes of the wiring grooves after expansion and contraction. The plating model is configured by a plurality of model equations. Model equations expressing a volume V and a height H of a copper plating formed on a certain area of a substrate surface will be shown with Equations 1 and 2.

$$\begin{cases} V = H_0(T_e L + D^2) = HD^2 + hD^2\rho_s + TD^2\rho \\ H = H_0 \dfrac{1-\rho}{1-\rho_2} \end{cases} \quad (1)$$

$$\begin{cases} V = H_0(T_e L + D^2) = HD^2 + hD^2\rho_e + TD^2\rho \\ H = H_0 \end{cases} \quad (2)$$

In equations (1) and (2), V is a volume of the copper plating, L is a length of an edge of a wiring, T is a height of a wiring groove formed on the substrate surface, $T_e$ is an effective height, D is a length of a side of a square area on the substrate surface, $\rho$ is a wiring density, $\rho_s$ is a wiring density during contraction, and $\rho_e$ is a wiring density during expansion. $H_0$ is a height of the copper plating when the wiring groove is not formed on the substrate surface. The volume V is a volume of the copper plating whose one side on the substrate surface is formed on the square area of D.

Various model equations expressing the shapes of the wiring grooves after expansion and contraction included in the plating model will then be described, though detailed description will be stated later. The various model equations expressing the shapes after expansion and contraction included in the plating model are, for example, a model equation relating to the effective height $T_e$, a model equation relating to the contraction width $\delta_s$, and a model equation relating to the expansion width $\delta_e$.

The model equation relating to the effective height $T_e$ will first be described. The amount of deposition (e.g., copper plating) accumulated on a certain region (e.g., on a substrate surface) is usually greater on the parts that grooves are formed than on the flat parts that the grooves, etc., are not formed. In other words, the amount of deposition accumulated on a certain region is proportional to the surface area of the region.

Figure 9:
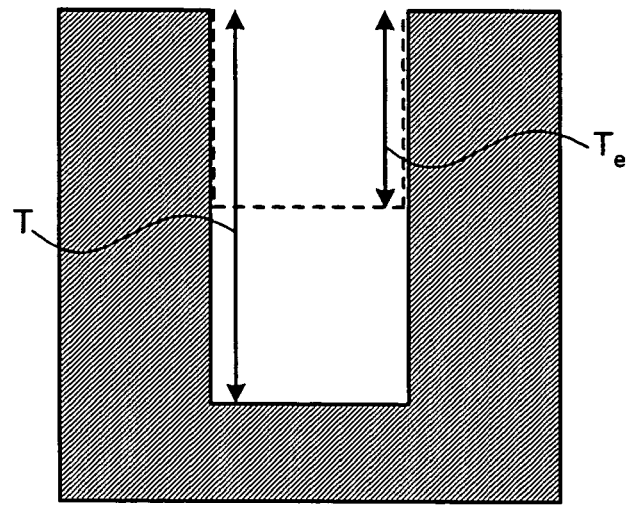
FIG. 9 is a schematic for explaining one example of the wiring groove formed on a substrate surface.

FIG. 9 is an explanatory view of one example of a wiring groove formed on a substrate surface. When finding the surface area of the wiring groove part, the effective height $T_e$ proportional to the wiring width w of the wiring groove is used to find the height of a sidewall of the wiring groove instead of using the actual height T. The effective height $T_e$ is a height (depth) from the top surface of the wiring groove.

Since the effective height $T_e$ is smaller than the actual height T, the surface area of the wiring groove is the part illustrated in FIG. 9 with dotted lines, for example.

Specifically, the effective height $T_e$ is a model equation expressing a change in the height of the wiring grooves from the groove base, is proportional to the wiring width w of the wiring groove, and becomes a constant value "$T_{e1}$" when the effective height $T_e$ becomes more than a certain value. An equation (3) for finding the effective height $T_e$ is shown.

$$T_e = \min(\alpha_1 w^{\beta_1}, T_{e1}) \quad (3)$$

In the equation (3), $\alpha_1$, $\beta_1$, and $T_{e1}$ are parameters that take various values based on contents written in the condition file. Specific contents written in the condition file will then be described. Variable ranges of the various parameters included in the model equation expressing the shapes of the wiring grooves after expansion and contraction and possible values of the various parameters within the variable ranges are written in the condition file.

For example, "$0<\alpha_1<1$" and "$-1<\beta_1<1$" are written in the condition file as variable ranges of the parameters $\alpha_1$ and $\beta_1$ included in the equation (3). Possible values of the parameters $\alpha_1$ and $\beta_1$ are also written in the condition file. For example, initial values are "$\alpha_1=0.1$" and "$\beta_1=-0.9$", and each of the parameters may take a value of "0.1" added to the initial value. Various parameters may take various values based on the contents written in the condition file.

The contraction width $\delta_s$ and the expansion width $\delta_e$ of the wiring grooves when the electrolytic plating is applied on the substrate surface will be described. The contraction width $\delta_s$ is proportional to the wiring space s and becomes a constant value "(w+s)/2" when the contraction width $\delta_s$ becomes more than a certain value. The constant value "(w+s)/2" is a value of dividing the value of addition of the wiring width w and the wiring space s into half. An equation (4) for finding the contraction width $\delta_s$ is shown.

$$\delta_s = \min\left(\alpha_2 w^{\beta_2}, \frac{w+s}{2}\right) \quad (4)$$

The expansion width $\delta_e$ is proportional to the wiring width w and becomes a constant value "(w+s)/2" when the expansion width $\delta_s$ becomes more than a certain value. The constant value "(w+s)/2" is a value of dividing the value of addition of the wiring width w and the wiring space s into half. An equation (5) for finding the expansion width $\delta_e$ is shown.

$$\delta_e = \min\left(\alpha_3 w^{\beta_3}, \frac{w+s}{2}\right) \quad (5)$$

In equations (4) and (5), $\alpha_2$, $\alpha_3$, $\beta_2$, and $\beta_3$ are parameters that can be various values based on the contents written in the condition file.

A plating model modeling the irregular shape (shape of the irregularity) formed on the surface of the copper plating on the wiring grooves to a hemispheric shape to accurately find the volume of the copper plating formed on the substrate surface will then be described. Specifically, the volume of the irregularity in the equations (1) and (2) is illustrated as a hemispheric volume more accurately considering the shape of the irregularity.

Figure 10:
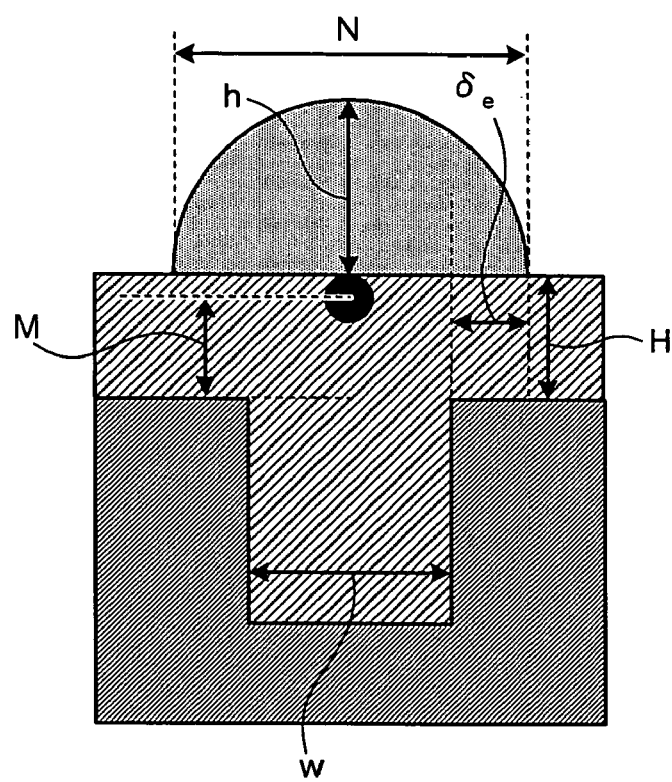
FIG. 10 is a schematic for explaining one example of the copper plating generated on the substrate surface (part 3)
Figure 11:
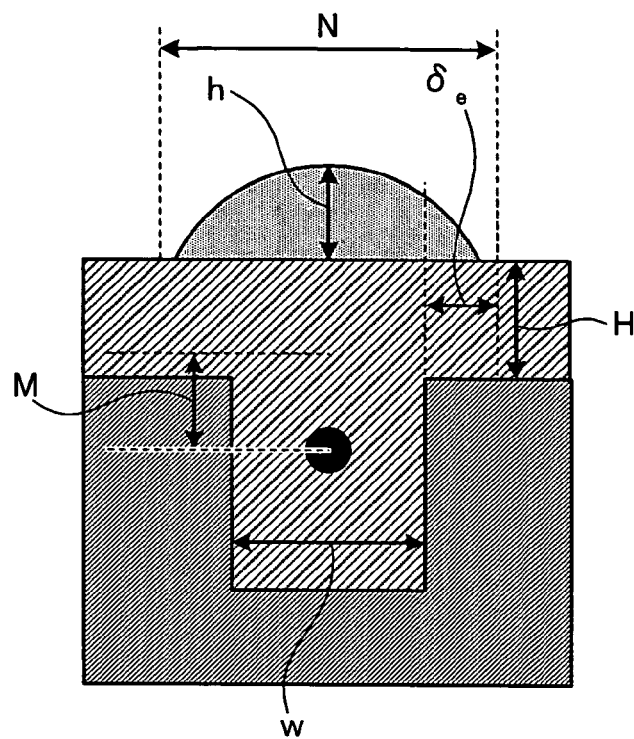
FIG. 11 is a schematic for explaining one example of the copper plating generated on the substrate surface (part 4)

The plating model modeling the convex portion generated on the copper plating surface to a hemispheric shape will be described. The convex portion formed on the wiring groove when the wiring groove has expanded (e.g., expands about "$\delta_e$" to one side) upon the application of the electrolytic plating usually becomes a part of the hemisphere. FIG. 10 is an explanatory view of one example of copper plating generated on a substrate surface (part 3). FIG. 11 is an explanatory view of one example of copper plating generated on a substrate surface (part 4).

As shown in FIGS. 10 and 11, hemispheric convex portions having points shown with black circles as the centers are formed on the wiring grooves. When the volume of the hemispheric convex portion is Sr, the equation (2) becomes the following equation (6).

$$\begin{cases} V = H_0(T_e L + D^2) = HD^2 + Sr + TD^2 \rho \\ H = H_0 \end{cases} \quad (6)$$

Specifically, Sr indicative of the volume of the hemispheric convex portion replaces "$hD^2\rho_e$" of the equation (2) indicative of the volume of the convex portion. The height h of the convex portion is found from the volume Sr of the hemispheric convex portion found using the equation (6) and the height H of the copper plating. A procedure to find the height h of the convex portion will now be described.

In the following description, R is the radius of the sphere forming the hemispheric convex portion on the wiring groove, M is the height from the substrate surface to the center of the sphere, and N is the width of the part that the hemispheric convex portion contacts the plating surface. When the center of the sphere (black circles in FIGS. 10 and 11) is at the position higher than the substrate surface, the height M to the center of the sphere is a positive value, and when the center of the sphere is at the position lower than the substrate surface, the height M to the center of the sphere is a negative value.

Using M, the radius R of the sphere can be illustrated "R=H+h−M". The width N of the hemispheric convex portion is "N=w+2$\delta_e$". When finding the height h of the convex portion, the volume Sr of the hemispheric convex portion and the height H of the copper plating are first found from the equation (6). Specifically, the volume Sr of the hemispheric convex portion and the height H of the copper plating are found by assigning the size data (wiring width, wiring space width, length of edge, etc.) of the wiring grooves to the equation (6). The radius R of the sphere is then found from the volume Sr of the hemispheric convex portion. The height h of the convex portion can be found from the radius R and the width N of the hemispheric convex portion.

When the radius R of the sphere becomes "(w+s)/2", the hemisphere becomes flat. In this case, the shape of the convex portion formed on the wiring groove becomes such a shape as shown in FIG. 5, and the volume of the convex portion becomes $hD^2\rho_e$, therefore, the height h of the convex portion is found with the equation (2). The volume of the concave portion generated on the copper plating surface may be modeled to a hemispheric shape as described to predict the film thickness of the copper plating.

A case of finding the height H of the copper plating and the height h of the convex and concave portions using the equations (1) and (6) (or equation (2)) will be specifically described. A relationship of the wiring width w, the wiring space width s, and the wiring density $\rho$ will be described with reference to FIGS. 6 and 7. The wiring density $\rho$ is converted using the wiring width w and the wiring space width s to use the wiring width w and the wiring space width s in the equations (1) and (2). The wiring density $\rho$ is a proportion of the wiring in a certain area, and fulfills an equation (7).

$$\rho = w/(w+s) \quad (7)$$

However, as described, the size of the wiring width w changes as the oxide film, i.e., the wiring groove expands and contracts when the electrolytic plating is applied to the substrate surface. For example, as shown in FIG. 6, if the wiring groove contracts for a length of "$\delta_s$" to one side when the electrolytic plating is applied to the substrate surface, the wiring width w narrows for a length of "2$\delta_s$". A relationship of the wiring width w, the wiring space width s, and the wiring density $\rho_s$ of this case will be illustrated with an equation (8).

$$\rho_s = (w - 2\delta_s)/(w+s) \quad (8)$$

As shown in FIG. 7, for example, if the wiring groove expands for a length of "$\delta_e$" to one side when the electrolytic plating is applied to the substrate surface, the wiring width w expands for a length of "2$\delta_e$". A relationship of the wiring width w, the wiring space s, and the wiring density $\rho_e$ in this case will be illustrated with an equation (9).

$$\rho_e = (w - 2\delta_e)/(w+s) \quad (9)$$

An example of a procedure of calculating the height H of the copper plating and the height h of the irregularity will then be described using the equations (1), (3), (4), (5), (6), (7), and (8). The equation (1) is first converted to an equation (10) using the equations (7) and (8).

$$\begin{cases} V = H_0(T_e L + D^2) = HD^2 + hD^2 \dfrac{w - 2\delta_s}{w+s} + TD^2 \dfrac{w}{w+s} \\ H = H_0 \dfrac{s}{s + 2\delta_s} \end{cases} \quad (10)$$

Using the equations (3) and (4), $T_e$ and $\delta_s$ are then converted to values that include various parameters. The size data of the wiring grooves and the possible values of the various parameters written in the condition file are assigned to calculate the height H of the copper plating and the height h of the irregularity. A total number of the calculation results equals to a number of multiplication of the number of possible values of the parameters and the number of combinations of the parameters.

When the height h of the irregularity found by using the equation (10) is a negative value (h<0), the height H of the copper plating and the height h of the irregularity are found by using the equation (6). Specifically, the equation (6) is first converted to a following equation (11) using the equation (7).

$$\begin{cases} V = H_0(T_e L + D^2) = HD^2 + Sr + TD^2 \dfrac{w}{w+s} \\ H = H_0 \end{cases} \quad (11)$$

Using the equation (3), $T_e$ in the equation (11) is then converted to a value that includes various parameters. A value found in the procedure is assigned to Sr in the equation (11). The size data of the wiring grooves and the possible values of the various parameters written in the condition file are then assigned to calculate the height H of the copper plating and the height h of the irregularity. A total number of the calculation results equals to a number of multiplication of the number of possible values of the parameters and the number of combinations of the parameters.

The calculation result calculated using the plating model and the measurement result of the TEG stored in the measurement value DB are then compared. Specifically, the difference between the calculation result calculated using the plating model and the measurement result of the TEG stored in the measurement value DB is calculated. The calculation method of the difference includes calculating the difference from the addition of root mean squares of the height H of the copper plating and the height h of the irregularity.

The values of the parameters that are sources of the calculation result calculated by using the plating model when the smallest difference is calculated are then extracted. Specifically, when $\alpha_1$, $\alpha_2$, $\alpha_3$, $\beta_1$, $\beta_2$, $\beta_3$, and $T_{e1}$ are "0.1, 0.1, 0.2, −0.1, −0.2, 0.1, 1", respectively, if the difference from the measurement result of the TEG is the smallest, these values are extracted as optimal values.

The film thickness simulation when measuring the film thickness of the copper plating generated on the substrate surface that actually is a subject to be designed will then be described. The film thickness of the copper plating generated on the substrate surface to be designed is measured here using the optimal values of the parameters extracted by conducting the calibration.

Figure 12:
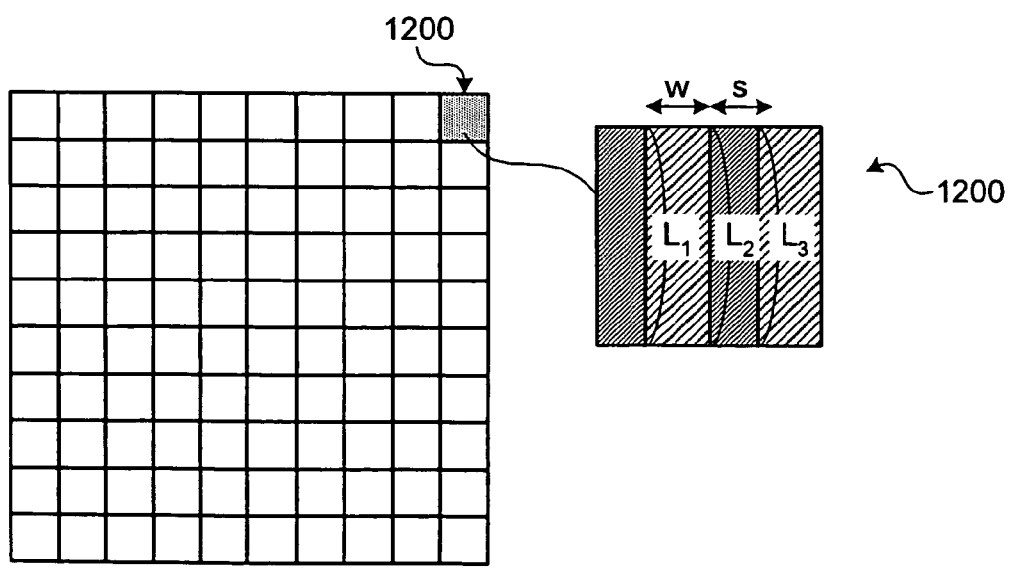
FIG. 12 is a schematic for illustrating a substrate surface divided into meshes.

The chip data DB storing information related to the substrate to be designed will be described. The chip data DB stores each of the wiring density $\rho$ and length L of the wiring edge of each mesh when the substrate surface to be designed is divided into meshes. FIG. 12 is an explanatory view of a substrate surface divided into meshes. FIG. 13 is an explanatory view of one example of a data structure of the chip data DB.

As shown in FIG. 12 the surface of the substrate to be designed is divided into meshes. Wiring grooves that actually form wirings are formed on the substrate surface. Each area is assumed to be a square area having a side of length D, and wirings of the same width are assumed to be formed at the same wiring space width in each area. The information concerning the substrate to be designed is stored in the chip data DB for each area.

As shown in FIG. 13, coordinates, wiring densities, and edge lengths of the areas are stored in the chip data DB. The edge length is a length of an edge of a wiring (or wiring groove) formed in each area. For example, an edge length L of an area 1200 of FIG. 12 is "$L=L_1+L_2+L_3$".

The film thickness of the copper plating formed on the substrate surface to be designed is predicted using the information stored in the chip data DB and the plating model assigned with optimal values of the parameters extracted by conducting the calibration.

One example of a procedure of finding the wiring width w and the wiring space s at each area will be described. The number of wirings at each area is first be found. Specifically, since wirings of the same wiring width are formed at the same wiring space in a square area having one side of a length D, the number of the wirings is L/2D that is the edge length divided by one side of the square area and divided in half. The wiring width w is "$w=\rho D/(L/2D)=2D^2\rho/L$" that is multiplication of the wiring density $\rho$ and one side D of the square area divided by the wiring number L/2D. The wiring space width s is "$s=w(1-\rho)/\rho$" according to the equation (7).

The wiring width w and the wiring space width s at each area are found using the wiring density $\rho$ and the edge length L of each area stored in the chip data DB. By assigning the wiring width w and the wiring space width s found here to the plating model assigned with the optimal, values of the parameters, the height H of the plating and the height h of the irregularity at each area on the substrate surface to be designed can be found.

More specifically, for example, $T_e$, $\delta_e$, and $\delta_s$ are delivered using the optimal values of the parameters extracted by conducting the calibration, and $\rho_s$ and $\rho_e$ are found from the equations (8) and (9). $\rho_s$ and $\rho_e$ found are then assigned to the equations (1) or (6) to find the height H of the copper plating and the height h of the irregularity at each area. The result found is outputted as a film thickness predicting file.

FIG. 14 is an explanatory view of one example of the film thickness predicting file. As shown in FIG. 14, the film thickness predicting file indicates, for each area, film thickness of the copper plating generated on the substrate surface that film thickness predicting simulation is conducted.

For example, as shown in FIG. 14, for the film thickness of the copper plating generated on the substrate surface at an area of x coordinate "50" and y coordinate "0", the height H of the copper plating is "200", and the height of the irregularity is "100". The film thickness of each area on the substrate surface to be designed is indicated this way.

Figure 15:
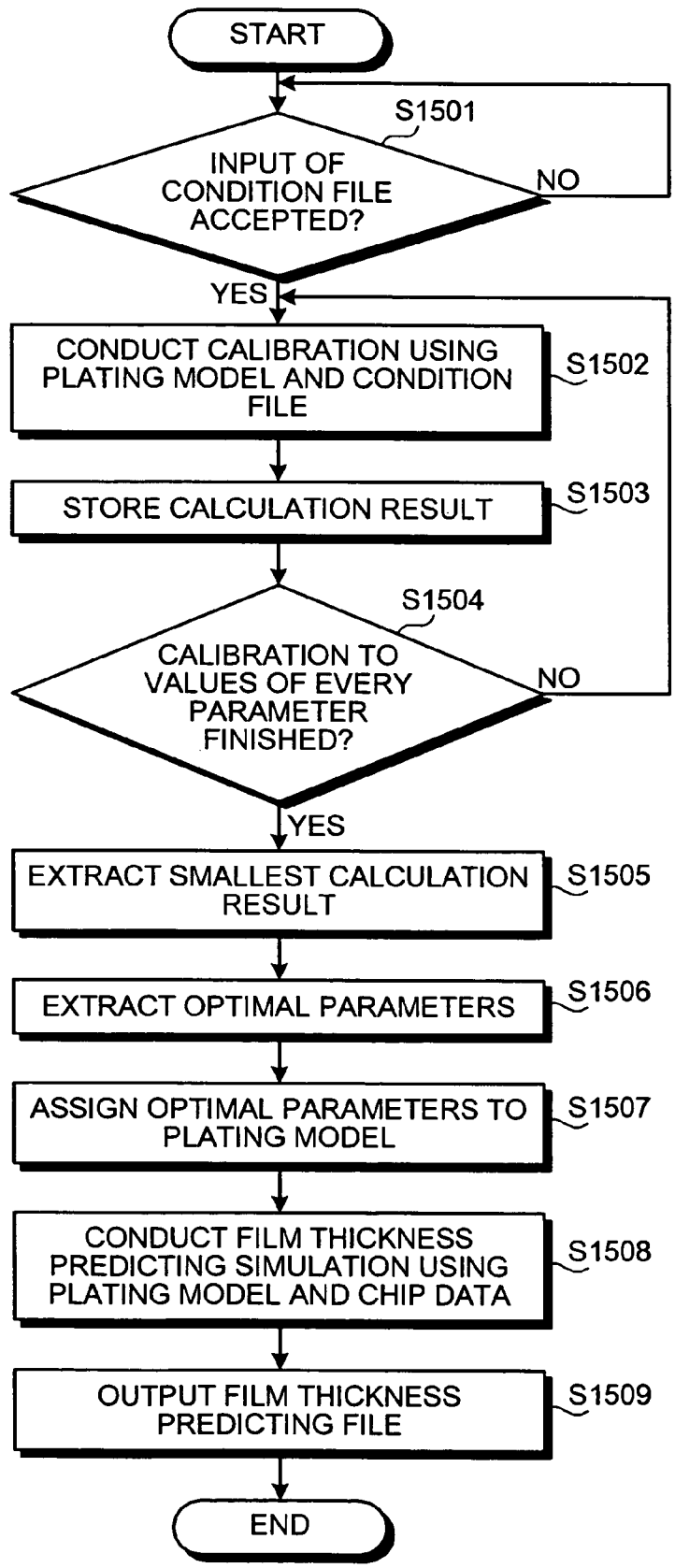
FIG. 15 is a flow chart of a film thickness predicting process performed by the film thickness predicting apparatus.

FIG. 15 is a flow chart of a film thickness predicting procedure conducted by the film thickness predicting apparatus. A film thickness predicting process when predicting the film thickness of the copper plating formed on the substrate surface will be described. In the flow chart of FIG. 15, the film thickness predicting apparatus first determines whether the apparatus has accepted an input of the condition file (step S1501).

The film thickness predicting apparatus waits for the condition file to be inputted (step S1501: No), and when the condition file is inputted (step S1501: Yes), the apparatus conducts the calibration using the plating model and the condition file (step S1502). Specifically, as described, the apparatus assigns the values of the parameters written in the condition file to the plating model to calculate the film thickness of the copper plating. The apparatus then compares the calculated values and the measurement values of the TEG to calculate the differences.

The film thickness predicting apparatus then stores the calculation result calculated by conducting the calibration to a recording medium such as the HD 405 (step S1503). The apparatus then determines whether the calibration to the values of every parameter written in the condition file has finished (step S1504).

When the calibration is not finished (step S1504: No), the procedure returns to step 1502, and the film thickness predicting apparatus changes values of the parameters for assigning to the plating model and conducts the calibration. The apparatus repeats the process of steps S1502 and S1503 until the calibration to the values of every parameter written in the condition file has finished.

When the calibration to the values of every parameter has finished at step S1504 (step S1504: Yes), the smallest calculation result is extracted from the calculation results stored in a recording medium such as the HD 405 (step S1505). The smallest calculation result is a calculation result of when the deviation amount between the value of the film thickness of the copper plating calculated using the plating model and the measurement value of the TEG is the smallest.

The film thickness predicting apparatus then extracts the values of the parameters that are sources of the calculation result extracted at step S1505 as optimal parameters from the possible values of the parameters written in the condition file (step S1506). The apparatus then assigns the extracted optimal parameters to the plating model (step S1507).

The film thickness predicting apparatus conducts a film thickness predicting simulation using the plating model assigned with the optimal parameters and the chip data of the substrate to be designed (step S1508). Specifically, the apparatus assigns the size data indicative of the shapes of the wiring grooves formed on the substrate to be designed written in the chip data to the plating model assigned with the optimal parameters to calculate the film thickness of the copper plating formed on the substrate surface to be designed.

The film thickness predicting apparatus lastly outputs a film thickness predicting file that the simulation result of the film thickness simulation is written (step S1509) and terminates the series of the processes of the flow chart.

According to the film thickness predicting apparatus of the embodiment of the present invention, the film thickness of the copper plating formed on the substrate surface to be designed can be accurately predicted by conducting the film thickness predicting simulation using the plating model expressing the shapes of the wiring grooves after expansion and contraction.

As described, the film thickness predicting program, the recording medium, the film thickness predicting apparatus, and the film thickness predicting method enable to accurately predict the film thickness of the copper plating formed on the substrate surface to be designed by conducting the film thickness predicting simulation using the plating model expressing the shapes of the wiring grooves after expansion and contraction.

The film thickness predicting method described in the embodiment can be realized by executing a program with a computer such as a personal computer and a workstation. The program is stored in a computer-readable recording medium such as an HD, an FD, a CD-ROM, an MO, and a DVD, and the computer reads the program from the recording medium and executes the program. The program may be a transmission medium distributable through a network such as the Internet.

According to the embodiments described above, it is possible to accurately predict film thickness of a thin film formed on a substrate surface.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A computer-readable recording medium that stores therein a computer program for predicting film thickness of a thin film formed on a substrate using a film thickness function model expressing volume and height of the thin film, with a test substrate having wiring grooves of a predetermined shape, the computer program making a computer execute:
   receiving input of possible values for parameters included in a groove-shape function model expressing a shape of the wiring grooves after expansion and contraction of wiring grooves;
   computing model values to specify the shape of the wiring grooves after expansion and contraction by substituting the values received into the groove-shape function model;
   calculating the film thickness by substituting the model values and size data of the wiring grooves into the film thickness function model;
   calculating a difference between the calculated film thickness and film thickness obtained by measuring the film thickness; and
   determining optimal values for the parameters from among the possible values of the parameters based on the calculated difference.

2. The computer-readable recording medium according to claim 1, wherein the determining includes determining, as the optimal values, values for the parameters corresponding to the film thickness for which the difference becomes the smallest.

3. The computer-readable recording medium according to claim 1, wherein the computer program further makes the computer execute: acquiring model values calculated by substituting the optimal values into the groove-shape function model, and calculating the film thickness by substituting the model values acquired at the acquiring and the size data into the film thickness function model.

4. The computer-readable recording medium according to claim 1, wherein the groove-shape function model expresses a change in expanding width and contracting width of the wiring grooves after expansion and contraction.

5. The computer-readable recording medium according to claim 1, wherein the groove-shape function model expresses a change in height from a groove base of the wiring grooves.

6. The computer-readable recording medium according to claim 1, wherein the film thickness function model models a convex-concave shape to a hemispheric shape, the convex-concave shape formed on a thin film surface of the wiring grooves as a result of expansion and contraction.

7. An apparatus for predicting film thickness that predicts film thickness of a thin film formed on a substrate using a film thickness function model expressing volume and height of the thin film, with a test substrate having wiring grooves of a predetermined shape, the apparatus comprising:
   a receiving unit that receives input of possible values for parameters included in a groove-shape function model expressing a shape of the wiring grooves after expansion and contraction of the wiring grooves;
   a computing unit that computes model values to specify the shape of the wiring grooves after expansion and contraction by substituting the values received into the groove-shape function model;
   a film thickness calculating unit that calculates the film thickness by substituting the model values and size data of the wiring grooves into the film thickness function model;
   a difference calculating unit that calculates a difference between the calculated film thickness and film thickness obtained by measuring the film thickness; and
   a determining unit that determines optimal values for the parameters from among the possible values of the parameters based on the calculated difference.

8. The apparatus according to claim 7, wherein the determining unit determines, as the optimal values, values for the parameters corresponding to the film thickness for which the difference becomes the smallest.

9. The apparatus according to claim 7, further comprising: an acquiring unit that acquires model values calculated by substituting the optimal values into the groove-shape function model, and a calculating unit that calculates the film thickness by substituting the model values acquired and the size data into the film thickness function model.

10. The apparatus according to claim 7, wherein the groove-shape function model expresses a change in expanding width and contracting width of the wiring grooves after expansion and contraction.

11. The apparatus according to claim 7, wherein the groove-shape function model expresses a change in height from a groove base of the wiring grooves.

12. The apparatus according to claim 7, wherein the film thickness function model models a convex-concave shape to a hemispheric shape, the convex-concave shape formed on a thin film surface of the wiring grooves as a result of expansion and contraction.

13. A method of predicting film thickness of a thin film formed on a substrate using a film thickness function model on a computer, the film thickness function model expressing volume and height of the thin film, with a test substrate having wiring grooves of a predetermined shape, the method comprising:

receiving input of possible values for parameters included in a groove-shape function model expressing a shape of the wiring grooves of the test substrate after expansion and contraction of the wiring grooves;

computing model values with the computer to specify the shape of the wiring grooves of the test substrate after expansion and contraction by substituting the values received into the groove-shape function model;

calculating the film thickness of the thin film formed on the substrate by substituting the model values and size data of the wiring grooves into the film thickness function model;

calculating a difference between the calculated film thickness and film thickness obtained by measuring the film thickness of the thin film formed on the substrate; and determining optimal values for the parameters from among the possible values of the parameters based on the calculated difference.

14. The method according to claim 13, wherein the determining includes determining, as the optimal values, values for the parameters corresponding to the film thickness for which the difference becomes the smallest.

15. The method according to claim 13, further comprising: acquiring model values calculated by substituting the optimal values into the groove-shape function model, and calculating the film thickness by substituting the model values acquired at the acquiring and the size data into the film thickness function model.

16. The method according to claim 13, wherein the groove-shape function model expresses a change in expanding width and contracting width of the wiring grooves after expansion and contraction.

17. The method according to claim 13, wherein the groove-shape function model expresses a change in height from a groove base of the wiring grooves.

18. The method according to claim 13, wherein the film thickness function model models a convex-concave shape to a hemispheric shape, the convex-concave shape formed on a thin film surface of the wiring grooves as a result of expansion and contraction.

\* \* \* \* \*